United States Patent
Hilscher et al.

(10) Patent No.: US 7,482,282 B2
(45) Date of Patent: Jan. 27, 2009

(54) USE OF DILUTE HYDROCHLORIC ACID IN ADVANCED INTERCONNECT CONTACT CLEAN IN NICKEL SEMICONDUCTOR TECHNOLOGIES

(75) Inventors: David F. Hilscher, Poughkeepsie, NY (US); Ying Li, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 11/691,001

(22) Filed: Mar. 26, 2007

(65) Prior Publication Data

US 2008/0236617 A1    Oct. 2, 2008

(51) Int. Cl.
    H01L 21/44    (2006.01)
(52) U.S. Cl. .................. 438/755; 438/682; 134/2; 257/E21.165; 257/E21.309
(58) Field of Classification Search .......... 438/682, 438/755; 134/2
    See application file for complete search history.

(56) References Cited

U.S. PATENT DOCUMENTS

| | | | |
|---|---|---|---|
| 5,967,794 A | 10/1999 | Kodama | |
| 6,492,216 B1 | 12/2002 | Yeo et al. | |
| 6,943,051 B2 | 9/2005 | Augusto et al. | |
| 7,018,901 B1 | 3/2006 | Thean et al. | |
| 7,037,818 B2 | 5/2006 | Dokumaci et al. | |
| 7,132,365 B2 * | 11/2006 | Crank et al. | 438/648 |
| 2002/0004303 A1* | 1/2002 | Agnello et al. | 438/689 |
| 2002/0068408 A1 | 6/2002 | Paton et al. | |
| 2004/0084145 A1 | 5/2004 | Pas | |
| 2005/0023587 A1 | 2/2005 | Lee et al. | |
| 2005/0092598 A1* | 5/2005 | Wang et al. | 204/192.17 |
| 2005/0143270 A1 | 6/2005 | Wojtczak et al. | |
| 2005/0145897 A1 | 7/2005 | Matsuo et al. | |
| 2005/0260807 A1 | 11/2005 | Orlowski et al. | |
| 2006/0035463 A1* | 2/2006 | Crank et al. | 438/683 |
| 2006/0073663 A1* | 4/2006 | Iinuma | 438/300 |
| 2006/0130746 A1* | 6/2006 | Terashima et al. | 117/95 |
| 2006/0281271 A1* | 12/2006 | Brown et al. | 438/303 |
| 2007/0197029 A1* | 8/2007 | Halimaoui | 438/658 |

* cited by examiner

Primary Examiner—Alexander G Ghyka
(74) Attorney, Agent, or Firm—Yuanmin Cai; Howard Cohn

(57) ABSTRACT

A method for cleaning oxide from the interconnects of a semiconductor that are comprised of nickel (Ni) silicide or nickel-silicide alloys where nickel is the primary metallic component is disclosed. The cleaning comprises performing an SC1 cycle, exposing the wafer comprising a NiSi contact to an SC1 solution. This removes oxygen atoms from the silicon oxide of the nickel silicide. Next, a rinse cycle is performed on the wafer to remove the SC1 solution. Finally, an HCl cycle is performed. During this cycle, the wafer comprising an NiSi contact is introduced to an HCl solution, removing oxygen atoms from the nickel oxide of the NiSi. The method of the present invention provides for lower contact resistance of NiSi semiconductor devices, facilitating semiconductor devices that have the benefits of miniaturization allowed by the NiSi technology, and higher performance due to the reduced contact resistance.

1 Claim, 2 Drawing Sheets

USE OF DILUTE HYDROCHLORIC ACID IN ADVANCED INTERCONNECT CONTACT CLEAN IN NICKEL SEMICONDUCTOR TECHNOLOGIES

FIELD OF THE INVENTION

The present invention relates generally to the manufacture of semiconductor devices and, more particularly, to the cleaning of nickel (Ni) silicide interconnects or nickel-silicide alloys where nickel is the primary metallic component.

BACKGROUND

Individual semiconductor devices in integrated circuits (ICs) are interconnected by means of one or more patterned conductive layers overlying the semiconductor devices. It is particularly advantageous to provide a plurality of patterned conductive layers separated from one another and from the underlying semiconductor devices by layers of insulating material. This practice permits a higher density of interconnections per unit area than can be provided by a single patterned conductive layer, and simplifies design by permitting interconnection paths implemented in one conductive layer to cross over interconnection paths implemented in other conductive layers.

Multilevel interconnection structures are conventionally made by alternately depositing and patterning layers of conductive material, and layers of insulating material. Small holes are formed in the insulating layers to permit interconnection to underlying conductive layers or device contacts. There is a need to improve the operative performance of the device contacts, typically a metal silicide. In particular, the resistivity of the contacts must be reduced to improve circuit performance. The device contacts are typically a silicide film, which is often a titanium silicide (TiSi) or a cobalt silicide (CoSi). One of the ways to reduce the resistivity of the contacts is to employ a nickel silicide (NiSi) instead of TiSi or CoSi. The NiSi provides for a lower contact resistance, allowing further miniaturization of semiconductor device.

During formation of the contact openings, contaminants and impurities often form on the silicon surface of the wafer. Sometimes, because of the increasingly small size of the holes and/or the high aspect ratio of the holes, it is difficult to clean the bottoms of the holes subsequent to etching. The presence of contaminants and impurities contributes significantly to high contact resistance because the contaminants and impurities act as insulators between the substrate surface and the metal that is to be later deposited into the hole. With this in mind, regardless of the type of silicide used, the device contacts must be thoroughly cleaned as part of the manufacturing process.

Referring to FIG. 1, a diagram of a portion 100 of a semiconductor device is shown. Oxide portions 102A and 102B are disposed on top of NiSi layer 104. In a typical manufacturing process, the oxide is applied as a layer over the silicide layer 104, followed by a dry etch process to form a cavity 105, and to expose the silicide layer 104, as is known in the art.

FIG. 2 illustrates, conceptually, the chemical arrangement of the nickel silicide layer 104. In this case, both the nickel atoms, indicated as "Ni", and the silicon atoms, indicated as "Si", have oxygen atoms (indicated as "O" attached). These oxygen atoms interact with the Nickel and Silicon atoms to form an oxide layer on the surface of the contact. This oxide layer increases contact resistance, and is therefore preferably removed or minimized prior to the filling of cavity 105 with a conductive material, such as tungsten, to form a connection to a subsequent metallization layer (not shown).

Prior art methods of contact clean for NiSi contacts include removing the oxygen from the Si oxide, but not from the Ni oxide, thereby performing a suboptimal contact clean. As NiSi use is becoming more prevalent in semiconductor manufacturing, there is a need to improve the performance of semiconductors that employ an NiSi technology.

SUMMARY OF THE INVENTION

According to the present invention, a method is provided for cleaning oxide from NiSi contacts within a semiconductor contact of at least one semiconductor device during the manufacture of a wafer with the at least one semiconductor device, comprising the steps of:

exposing the wafer having NiSi contacts to a SC1 solution for removing oxygen atoms from the silicon oxide of the NiSi contacts;

exposing the wafer to a first rinse solution for removing the SC1 solution from the wafer;

exposing the wafer to an HCl solution for removing oxygen atoms from the nickel oxide of the NiSi contacts; and exposing the wafer to a second rinse solution for removing the HCl solution from the wafer.

Additionally, according to the present invention, the step of performing an HCl cycle comprises introducing the wafer to an HCl solution ranging from approximately 5 parts water to 1 part HCl by volume, to approximately 200 parts water to 1 part HCl by volume.

Additionally, according to the present invention, the step of performing an HCl cycle comprises introducing the wafer to an HCl solution comprised of approximately 50 parts water to 1 part HCl by volume.

Additionally, according to the present invention, the step of performing an SC1 cycle comprises introducing the wafer to an SC1 solution ranging from approximately 5 parts water to 1 part by volume of hydrogen peroxide, and 1 part by volume of ammonium hydroxide, to approximately 200 parts water to 1 part by volume of hydrogen peroxide, and 1 part by volume of ammonium hydroxide.

Additionally, according to the present invention, the step of performing an SC1 cycle comprises introducing the wafer to an SC1 solution comprising approximately 50 parts by volume of water, 1 part by volume of hydrogen peroxide, and 1 part by volume of ammonium hydroxide.

Additionally, according to the present invention, the step of performing a SC1 cycle comprises introducing the wafer to a SC1 solution for a time ranging from about 2 minutes to about 15 minutes.

Additionally, according to the present invention, the step of performing a SC1 cycle comprises introducing the wafer to a SC1 solution for approximately 5 minutes.

Additionally, according to the present invention, the step of performing an HCl cycle comprises introducing the wafer to a HCl solution for a time ranging from about 2 minutes to about 15 minutes.

Additionally, according to the present invention, the step of performing an HCl cycle comprises introducing the wafer to an HCl solution for approximately 5 minutes.

Additionally, according to the present invention, the step of performing a rinse cycle comprises introducing the wafer to a rinse solution for a time ranging from about 2 minutes to about 15 minutes.

Additionally, according to the present invention, the step of performing a rinse cycle comprises introducing the wafer to a rinse solution for approximately 5 minutes.

Additionally, according to the present invention, the step of performing a rinse cycle comprises introducing the wafer to a rinse solution comprising deionized water.

According to the present invention, a method is provided for cleaning oxide from nickel silicide within a semiconductor contact during the manufacture of a wafer with one or more semiconductor devices, comprising the steps of:

performing an SC1 cycle, whereby the wafer comprising a nickel silicide contact is introduced to an SC1 solution, the SC1 solution SC1 solution comprising approximately 50 parts by volume of water, 1 part by volume of hydrogen peroxide, and 1 part by volume of ammonium hydroxide, thereby removing oxygen atoms from the silicon atoms of the nickel silicide;

performing a first rinse cycle on the wafer, whereby the wafer comprising a nickel silicide contact is introduced to a rinse solution comprised of deionized water, thereby removing the SC1 solution from the wafer;

performing an HCl cycle, whereby the wafer comprising a nickel silicide contact is introduced to an HCl solution, the HCl solution comprised of approximately 50 parts water to 1 part HCl by volume, thereby removing oxygen atoms from the nickel atoms of the nickel silicide; and performing a first rinse cycle on the wafer, whereby the wafer comprising a nickel silicide contact is introduced to a rinse solution comprised of deionized water, thereby removing the HCl solution from the wafer.

BRIEF DESCRIPTIONS OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGS.) of the drawing, in which case typically the last two significant digits may be the same, the most significant digit being the number of the drawing figure (FIG).

DETAILED DESCRIPTION

A method for improved contact cleaning of NiSi (nickel silicide) based contacts will now be described. The present invention comprises additional process steps over the prior art cleaning method.

The prior art cleaning method involves placing semiconductor device(s), in the form of wafer(s) in a cleaning tool, such as a batch wet deck. The wafers, comprising at least one semiconductor device having NiSi contacts, can then be exposed to one or more wet cleaning processes. One such process (typically used in combination with one or more additional processes) is sometimes referred to as "standard clean 1" or "SC1" and comprises immersing one or more wafers into a mixture of ammonium hydroxide, a peroxide such as $H_2O_2$ and water, for a period of time sufficient to remove one or more undesirable materials (e.g., residual photoresist particles, etc.) from the semiconductor device on the wafer. An exemplary SC1 solution comprises approximately 50 parts by volume of water, 1.5 parts by volume of hydrogen peroxide, and 1 part by volume of ammonium hydroxide.

The SC1 removes oxygen atoms from silicon oxide in the NiSi. However, it does not remove oxygen atoms from the nickel oxide within the NiSi. Therefore, the nickel oxide is not fully removed from the NiSi, which increases the contact resistance of the contacts. For optimal performance, the contact resistance should be minimized.

Figure 2:
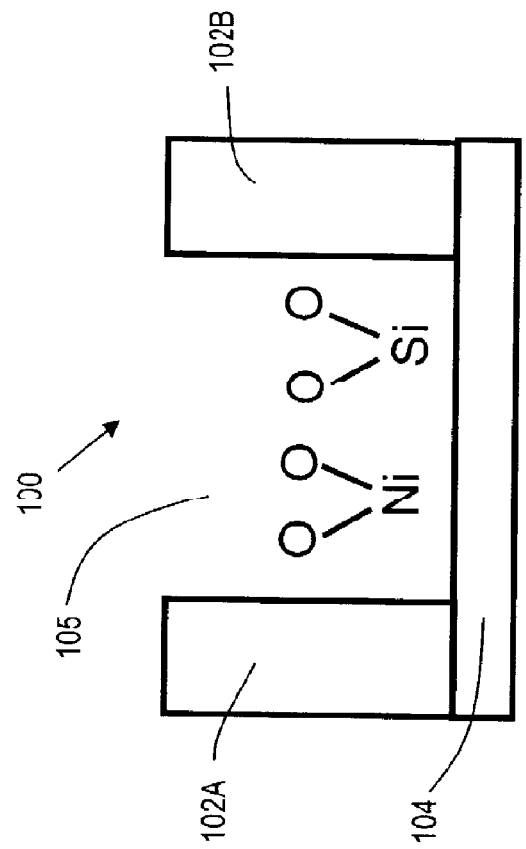
FIG. 2 shows a conceptual diagram similar to that of FIG. 1, indicating the chemical arrangement of a NiSi contact.
Figure 1:
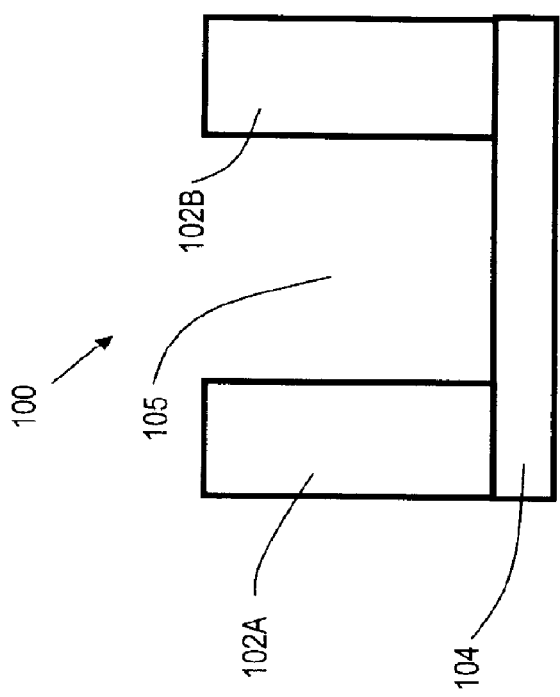
FIG. 1 shows a diagram of a portion of a semiconductor device.
Figure 3:
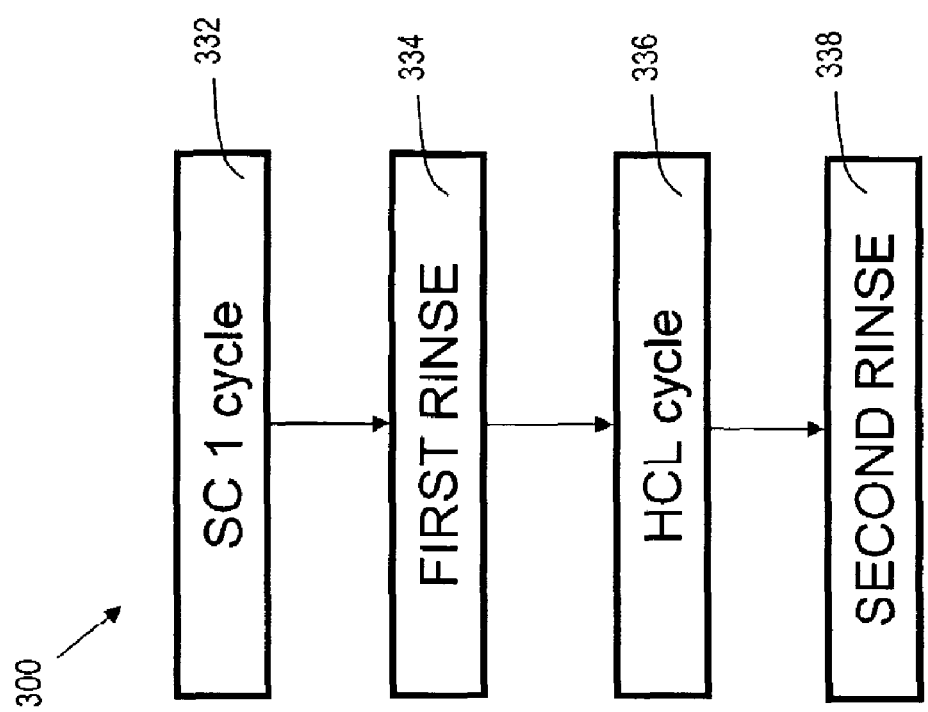
FIG. 3 shows a flowchart of process steps for carrying out the method of the present invention.

Referring to FIG. 3, process steps for the method of the present invention are shown in flowchart 300. In step 332, the SC1 cycle is performed. The latter step comprises immersing wafers in an SC1 solution for a predetermined period of time. The preferred time for the SC1 cycle ranges from about 2 minutes to about 15 minutes. If the time is too short, i.e. less than 2 minutes, then sufficient cleaning will not take place. However if the time is longer than necessary, i.e. more than 15 minutes, the manufacturing throughput. In one embodiment of the present invention, the SC1 cycle time is about 5 minutes. The SC1 solution preferably ranges from a ratio of 5:1:1 to 200:1:1 parts by volume of water, to hydrogen peroxide to ammonium hydroxide. In one embodiment of the invention the SC1 solution comprises about 50 parts water by volume, about 1 part hydrogen peroxide by volume, and about 1 part ammonium hydroxide by volume.

Next, in process step 334, the wafer is immersed in a rinse solution to remove the SC1 solution from the wafers. The rinse solution preferably comprises deionized (DI) water, although another rinse solution may be used without departing from the scope of the present invention. The preferred time for the rinse cycle ranges from about 2 minutes to about 15 minutes. If the time is too short, i.e. less than 2 minutes, then sufficient cleaning will not take place. Having a time longer than necessary, i.e. more than 15 minutes, reduces manufacturing throughput. In one embodiment of the present invention, the rinse cycle time is about 5 minutes.

Next, in process step 336, a Hydrochloric acid (HCl) cycle is performed. The wafer is immersed in a HCl solution. The HCl solution used is in the range from 5:1 (water to HCL parts by volume) to 200:1. In a preferred embodiment, the ratio is 50:1. If the solution is too weak, i.e., less than 5:1 (water to HCL parts by volume), the time of the HCl cycle would be prohibitively long. Conversely, it is not desirable to make the solution too strong, i.e., more than 200:1 (water to HCL parts by volume), as this wastes material, and presents environmental issues in terms of chemical disposal.

The preferred time for the HCl cycle ranges from about 2 minutes to about 15 minutes. As with the a rinse solution, if the time is too short, i.e. less than 2 minutes, then sufficient cleaning will not take place. Having a time longer than necessary, i.e. more than 15 minutes, reduces manufacturing throughput. In one embodiment of the present invention, the rinse cycle time is about 5 minutes.

Once the HCl cycle is complete, the wafers are subject to another rinse cycle, similar to the rinse cycle described previously. That is, in process step 338, the wafer is immersed in a rinse solution to remove the HCl solution from the wafers. The rinse solution preferably comprises deionized (DI) water, although another rinse solution may be used without departing from the scope of the present invention. The preferred time for the rinse cycle ranges from about 2 minutes to about 15 minutes. If the time is too short, i.e. less than 2 minutes, then sufficient cleaning will not take place. Having a time longer than necessary, i.e. more than 15 minutes, reduces manufacturing throughput. In one embodiment of the present invention, the rinse cycle time is about 5 minutes.

In a preferred embodiment, the process of the present invention comprises immersing a wafer through a 5 minute SC1 cycle, by the wafer's immersion in a 5 minute rinse cycle, followed by the wafer's immersion in a 5 minute HCl cycle, followed by the wafer's immersion in an additional 5 minute rinse cycle. The SC1 cycle removes the silicon oxide from the nickel silicide layer. The first rinse cycle removes the SC1 solution from the NiSi layer. The HCl cycle removes the oxygen atoms from the Ni oxide of the NiSi layer. Once the HCl cycle is complete, the wafers are subject to an additional rinse cycle, similar to the rinse cycle described previously. That is, the wafer is immersed in a rinse solution to remove the HCl solution from the wafers. Standard manufacturing methods known in the art can then be used to complete the manufacture of the semiconductor devices. The method of the present invention, thereby provides for improved contact clean in an NiSi based semiconductor device, thereby reducing contact resistance of the NiSi contacts, and improving the performance of the semiconductor device.

Because the method of the present invention does not use an oxidizer in the HCl cycle, such as hydrogen peroxide ($H_2O_2$), reoxidation of the contact does not occur. This invention also has the additional benefit that cleaning during the final step of the recipe can be done without adversely impacting the contact resistance.

The present invention provides a method for improved contact cleaning of NiSi based contacts. This results in a lower contact resistance of NiSi semiconductor devices, thereby providing for semiconductor devices that have the benefits of miniaturization allowed by the NiSi technology, and higher performance due to the reduced contact resistance.

What is claimed is:

1. A method for cleaning oxide from nickel silicide within a semiconductor contact during the manufacture of a wafer with one or more semiconductor devices, comprising the steps of:

performing an SC1 cycle, whereby the wafer comprising a nickel silicide contact is introduced to an SC1 solution for a time ranging from about 2 minutes to about 15 minutes, said SC1 solution ranging from approximately 50 parts by volume of water to 1 part by volume of hydrogen peroxide, and 1 part by volume of ammonium hydroxide to approximately 200 parts by volume of water to 1 part by volume of hydrogen peroxide and 1 part by volume of ammonium hydroxide, thereby removing oxygen atoms from the silicon oxide of the nickel silicide;

performing a first rinse cycle on the wafer comprising introducing said wafer to a rinse solution for a time ranging from about 2 minutes to about 15 minutes, whereby the wafer comprising a nickel silicide contact is introduced to a rinse solution comprised of deionized water, thereby removing the SC1 solution from the wafer;

performing an HCl cycle, whereby the wafer comprising a nickel silicide contact is introduced to an HCl solution for a time ranging from about 2 minutes to about 15 minutes, said HCl solution ranging from approximately 50 parts water to 1 part HCl by volume to approximately 200 parts water to 1 part HCl by volume, thereby removing oxygen atoms from the nickel oxide of the nickel silicide; and performing a second rinse cycle on the wafer, whereby the wafer comprising a nickel silicide contact is introduced to a rinse solution comprised of deionized water, thereby removing the HCl solution from the wafer.

* * * * *